United States Patent [19]

Astegher et al.

[11] Patent Number: 5,047,666
[45] Date of Patent: Sep. 10, 1991

[54] FAST SAMPLE AND HOLD CIRCUIT CONFIGURATION

[75] Inventors: Berthold Astegher, Klagenfurt; Alexander Lechner, Faak/See; Hermann Jessner, Villach, all of Austria

[73] Assignee: Siemens Aktiengesellschaft, Munich, Fed. Rep. of Germany

[21] Appl. No.: 513,910

[22] Filed: Apr. 24, 1990

[30] Foreign Application Priority Data

Apr. 24, 1989 [EP] European Pat. Off. ........ 89107375.1

[51] Int. Cl.$^5$ .............................................. G11C 27/02
[52] U.S. Cl. .................................. 307/353; 307/264; 307/491; 307/494
[58] Field of Search ............... 307/353, 264, 475, 491, 307/494

[56] References Cited

U.S. PATENT DOCUMENTS 3,452,289  6/1969  Ryan .
4,302,689  11/1981  Brodie .
4,370,572  1/1983  Cosand et al. .................... 307/353
4,634,993  1/1987  Koen .
4,873,457  10/1989  Sanielevici ........................ 307/353

FOREIGN PATENT DOCUMENTS 2083723  3/1982  United Kingdom .

OTHER PUBLICATIONS

IEEE Journal of Solid ∝ State Circuits, Feb. 1970, pp. 45-48; C. R. Ryan: "Applications of a Four-Quadrant Multiplier".

Primary Examiner—John Zazworsky
Attorney, Agent, or Firm—Herbert L. Lerner; Laurence A. Greenberg

[57] ABSTRACT

A circuit configuration includes a symmetrically constructed sample and hold amplifier. A first switchable level shifter has an input in the form of a first signal input terminal for receiving a given signal, and an output being connected to the sample and hold amplifier for supplying a differential output signal. A second switchable level shifter has an input in the form of a second signal input terminal for receiving a signal complementary to the given signal, and an output being connected to the sample and hold amplifier for supplying a differential output signal. The input and output signals of each of the switchable level shifters having a different constant direct voltage difference as a function of the switching state of the level shifters.

11 Claims, 5 Drawing Sheets

FAST SAMPLE AND HOLD CIRCUIT CONFIGURATION

The invention relates to a circuit configuration including a symmetrically constructed sample and hold amplifier including first, second, third and fourth transistors each having a collector, an emitter and a control terminal, the collectors of the first and the third transistors being interconnected to form a first output terminal, the collectors of the second and the fourth transistors being interconnected to form a second output terminal, a first collector resistor connected between the first output terminal and a first supply potential, a second collector resistor connected between the second output terminal and the first supply potential, the first output terminal being connected to the control terminal of the fourth transistor, the second output terminal being connected to the control terminal of the third transistor, a hold capacitor connected between the first and second output terminals, the emitter of the first transistor being directly connected to the emitter of the third transistor, the emitter of the second transistor being directly connected to the emitter of the fourth transistor, at least one resistor connected between the emitters of the first and third transistors and the emitters of the second and fourth transistors, and at least one constant current impressing means connecting the emitters of the first and third transistors and the emitters of the second and fourth transistors to each other and to a second supply potential, and the control terminals of the first and second transistors can be acted upon by a differential signal.

Sample and hold, or track and hold, circuits are needed above all for analog/digital converters, in order to keep the input voltage constant for the duration of the process of converting an analog input voltage to a digital output word and thus to preclude errors. A sample and hold circuit (S/H) accordingly samples an analog voltage signal at predetermined times and keeps the instantaneous voltage value constant in analog form during the hold phase.

A publication by Tanaka et al entitled "A 40 MS/s Monolithic S/H IC", ISSCC 83, page 190, discloses a sample and hold circuit, the principle of which is shown and more fully described below in the description of the figures. Faster sample and hold amplifiers require expensive circuits with field effect and bipolar transistors of both conduction types and are virtually unknown in a monolithically integrated form. The integrated circuit according to the aforementioned publication operates at a sampling frequency of up to 40 MHz.

During the hold phase in sample and hold circuits, the problem which arises is that the voltage, which is held by a capacitor, is sensed with the aid of an amplifier, and during that process, charges flow out through the terminal input resistor of the amplifier, causing a drop in the voltage applied through the capacitor. In order to assure malfunction-free operation, a capacitor that must not be overly small and thus limit the operating speed of the sample and hold circuit is accordingly needed as the hold capacitor.

An article by C. R. Ryan, entitled "Applications of a Four-Quadrant Multiplier", IEEE Journal of Solid-State Circuits, Feb. 1970, pp. 45-48 discloses a sample and hold circuit in which the amplification deviations of a regenerative amplifier affects the hold time. FIG. 2 shows such a known circuit having a signal input, a control input and a feedback circuit.

U.S. Pat. No. 3,452,289 discloses a signal processing unit that is more fully described below in the description of the figures. In such known circuits, toggling between the sample phase and the hold phase is carried out by providing that the current in the various current paths of the sample and hold amplifier circuit is toggled. In other words, the current through the current path activated in the sample phase is switched off, and the current through the other current path, the one activated in the hold phase, is switched on. If such known circuits are constructed in such a way that they operate with differential (symmetrical) signals, then currents of different magnitudes flow in the sampling phase in the various current paths of the sample and hold amplifier. If toggling between the sampling and the hold phase is carried out by toggling the currents, in other words by switching them on or off, then the currents of various magnitude dictated by the triggering of the signal input cause a variable switching behavior. That leads to jumps in the signal at the output of the sample and hold circuit.

It is accordingly an object of the invention to provide a fast sample and hold configuration for processing differential signals, which overcomes the hereinafore-mentioned disadvantages of the heretofore-known devices of this general type, which does not cause any signal jump at the output upon toggling over from the sampling to the hold phase and thus makes a smaller hold capacity or a faster processing speed possible.

With the foregoing and other objects in view there is provided, in accordance with the invention, a circuit configuration, comprising a symmetrically constructed sample and hold amplifier including first, second, third and fourth transistors each having a collector, an emitter and a control terminal, the collectors of the first and the third transistors being interconnected to form a first output terminal, the collectors of the second and the fourth transistors being interconnected to form a second output terminal, a first collector resistor connected between the first output terminal and a first supply potential, a second collector resistor connected between the second output terminal and the first supply potential, the first output terminal being connected to the control terminal of the fourth transistor, the second output terminal being connected to the control terminal of the third transistor, a hold capacitor connected between the first and second output terminals, the emitter of the first transistor being directly connected to the emitter of the third transistor, the emitter of the second transistor being directly connected to the emitter of the fourth transistor, at least one resistor connected between the emitters of the first and third transistors and the emitters of the second and fourth transistors, and at least one constant current impressing means connecting the emitters of the first and third transistors and the emitters of the second and fourth transistors to each other and to a second supply potential; a first switchable level shifter having an input in the form of a first signal input terminal for receiving a given signal, and an output being connected to the control terminal of the first transistor for supplying a differential output signal; and a second switchable level shifter having an input in the form of a second signal input terminal for receiving a signal complementary to the given signal, and an output being connected to the control terminal of the second transistor for supplying a differential output signal; the input and output signals of each of the switchable level shifters having a different constant direct voltage difference as a function of the switching state of the level shifters.

In accordance with another feature of the invention, there is provided a first impedance converter having an output connected to the first output terminal and a control terminal connected to the collectors of the first and third transistors, the first collector resistor being connected between the collectors of the first and third transistors and the first supply potential; and a second impedance converter having an output connected to the second output terminal and a control terminal connected to the collectors of the second and fourth transistors, the second collector resistor being connected between the collectors of the second and fourth transistors and the first supply potential.

In accordance with a further feature of the invention, the first and second impedance converters are transistors in emitter follower circuits having collectors connected to the first supply potential, the transistor of the first impedance converter having an emitter connected to the first output terminal, the transistor of the second impedance converter having an emitter connected to the second output terminal, and the at least one constant current impressing means are first constant current impressing means, and there are provided second constant current impressing means connected between the emitter of the transistor of the first impedance converter and a second supply potential, and third constant current impressing means connected between the emitter of the transistor of the second impedance converter and the second supply potential.

In accordance with an added feature of the invention, there is provided a first toggle switching the second constant current impressing means between the emitter of the transistor of the first impedance converter and a given supply potential such as the first supply potential, and a second toggle switching the third constant current impressing means between the emitter of the transistor of the second impedance converter and the given supply potential.

In accordance with an additional feature of the invention, there is provided a transistor having a controllable path connected between the first supply potential and the collector of the transistor of the first impedance converter, and a control terminal being acted upon by a signal derived from the signal present at the input of the second level shifter; and a transistor having a controllable path connected between the first supply potential and the collector of the transistor of the second impedance converter, and a control terminal being acted upon by a signal derived from the signal present at the input of the first level shifter.

In accordance with yet another feature of the invention, each of the level shifters includes an input transistor having a control terminal connected to the input of the level shifter for a signal to be sampled, a collector connected to the first supply potential and an emitter; and there is provided at least one shift resistor connected to the emitter of the input transistor; an output transistor having a control terminal connected to the at least one shift resistor, a collector connected to the first supply potential and an emitter forming the output of the level shifter; a toggle having one alternating input connected to the at least one shift resistor, another alternating input connected to the emitter of the input transistor and a central input; other constant current impressing means connected between the central input and the second supply potential; and further constant current impressing means connected between the emitter of the output transistor and the second supply potential.

In accordance with yet a further feature of the invention, there is provided another transistor having an emitter and a collector and having a control terminal connected to the emitters of the first and third transistors, a first emitter resistor having one terminal connected to the emitters of the first and third transistors; a further transistor having an emitter and a collector and having a control terminal connected to the emitters of the second and fourth transistors, a second emitter resistor having one terminal connected to the emitters of the second and fourth transistors; the first and second emitter resistors having other terminals being connected to each other and being connected through the at least one constant current impressing means to the second supply potential; a series circuit having two additional resistors being interconnected at a circuit node, the series circuit being connected between the emitter of the other transistor and the emitter of the further transistor; further constant current impressing means connected between the circuit node and the second supply potential; another resistor connected between the collector of the other transistor and the first supply potential; and a further resistor connected between the collector of the further transistor and the first supply potential.

In accordance with yet an added feature of the invention, there are provided diodes connected in the conducting direction, each of the diodes being connected between the first supply potential and a respective one of the first and second collector resistors.

In accordance with a concomitant feature of the invention, each of the diodes has a diode path in the form of a respective transistor having an emitter and a short-circuited collector and control terminal, and there are provided added and additional transistors each having a control terminal connected to the emitter of a respective one of the transistors of the diodes, the collectors of the added and additional transistors being directly acted upon by the first supply potential, the other resistor being connected between the emitter of the added transistor and the collector of the other transistor, and the further resistor being connected between the emitter of the additional transistor and the collector of the further transistor.

An advantage of the circuit configuration according to the invention is that metastable states of the amplifier are utilized for storing the sampled analog voltage in memory, so that in the ideal case the circuit configuration can be operated without a further stabilization network.

Other features which are considered as characteristic for the invention are set forth in the appended claims.

Although the invention is illustrated and described herein as embodied in a fast sample and hold circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
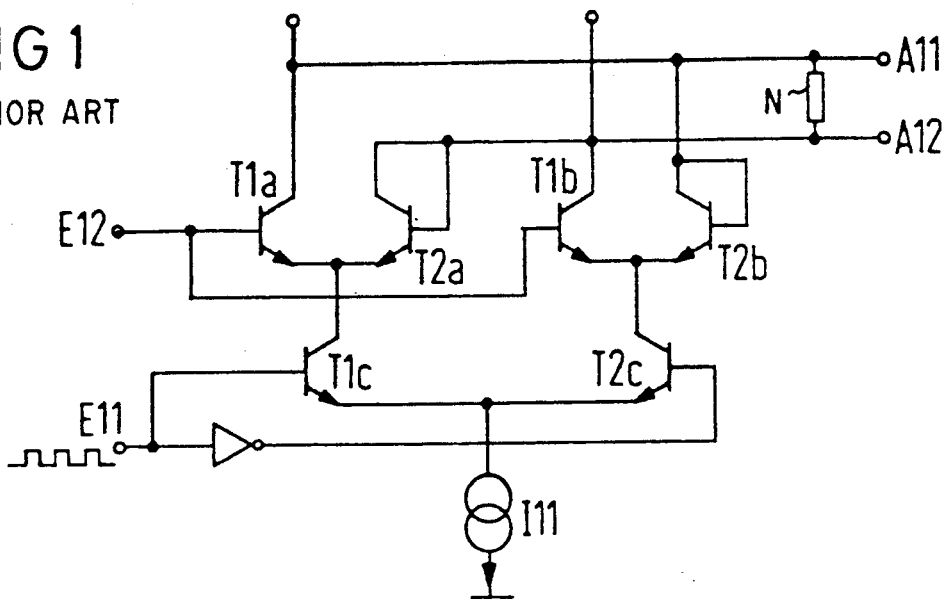
FIG. 1 is a schematic circuit diagram of a known sample and hold circuit.

Referring now in detail to the figures of the drawing in which identical elements are identified by the same reference numerals and in which the basic principle of the sample and hold circuits used in circuits according to the invention is first addressed in terms of exemplary embodiments shown in FIGS. 1-6 in order to explain the invention in further detail, and first, particularly, to FIG. 1 thereof, there is seen a first differential amplifier having first and second semiconductor components T1c, T2c in the form of transistors with interconnected emitters. Each of these semiconductor elements has a control input for receiving a first input signal E11 and a collector terminal.

A second differential amplifier is formed of third and fourth semiconductor components T1a, T2a in the form of transistors and a third differential amplifier is formed of fifth and sixth semiconductor components T1b, T2b in the form of transistors. Each semiconductor component of the second and third differential amplifiers has a collector, a control input and an emitter. The emitter terminals of the transistors in the second differential amplifier are connected to each other and to the collector of the first semiconductor component T1c, and the emitter terminals of the transistors in the third differential amplifier are connected to each other and to the collector of the second semiconductor component T2c. The control inputs of the third and fifth semiconductor components T1a, T1b are interconnected to receive a second input signal, the collector terminals of the third and sixth semiconductor components T1a, T2b are interconnected and form a first output terminal A11, the collector terminals of the fourth and fifth semiconductor components T2a, T1b are likewise interconnected and form a second output terminal A12, the first output terminal A11 is connected through translating network N to the second output terminal A12, the first output terminal A11 is connected to the control input of the sixth semiconductor component T2b, the second output terminal A12 is connected to the control input of the fourth semiconductor component T2a, and the control inputs of the first and second semiconductor components T1c, T2c are acted upon by the first input signal E11 in such a manner that these two semiconductor components alternatingly conduct a current or are blocked.

Figure 2:
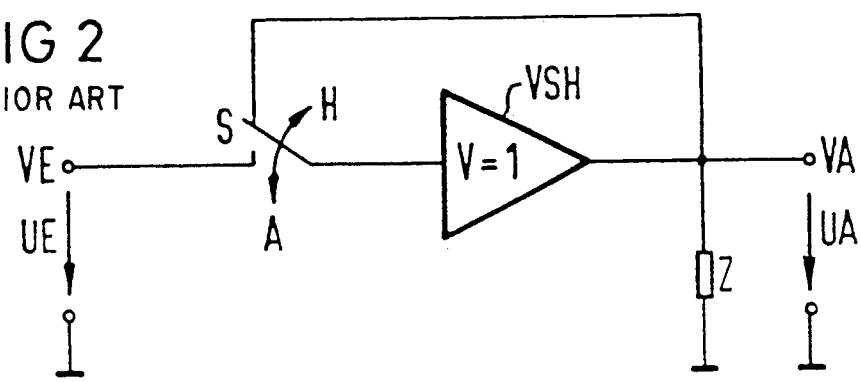
FIG. 2 is a circuit diagram of a known sample and hold circuit of the kind which is important for circuits according to the invention.

In the sample and hold circuit according to FIG. 2, a complex stabilization network Z, which in the simplest case may be in the form of a capacitor, is connected through a switch S to an input terminal VE, which is loaded with a voltage that is proportional to or equal to an input voltage UE when the switch is in a closed position in a sampling phase A. During a hold phase, when the switch S is in a position H, the voltage at the capacitor is sampled with high impedance with the aid of an amplifier VSH and is available as an output voltage UA at an output terminal VA of the amplifier, referred to a reference terminal.

The switch S must be capable of switching over from as low-impedance a state during the sampling phase A to as high-impedance a state as possible during the hold phase H in order to be capable of quickly reloading the capacitor, so as not to influence the voltage value stored in memory with the aid of the capacitor. Versions of sample and hold circuits operate in the frequency range of up to approximately 10 MHz with field effect transistors.

The circuit configuration according to FIG. 2 utilizes metastable states of the amplifier VSH, in order to keep an analog input voltage UE, which is sampled with the aid of the switch S, constant for a predetermined period of time or during the hold phase H. The switch S is only located on the input side of the amplifier VSH, the amplification V of which must be exactly 1. During the hold phase H, the amplifier output or the output terminal VA is fed back through the switch S directly to the amplifier input.

In the exemplary embodiment of FIG. 2, the complex stabilization network Z, which in the simplest case may be in the form of a capacitor as mentioned above, is connected between the output terminal VA and the reference terminal, which is not identified by reference numeral. Under ideal conditions for the sample and hold circuit configuration, the complex stabilization network Z can be omitted, without any change in the output voltage UA in the hold phase. Taking into account actual physical conditions, an offset $\Delta u$ and a deviation of the amplification V from the ideal value 1 by a value $\Delta v$ must be taken into account for the amplifier VSH.

Figure 3:
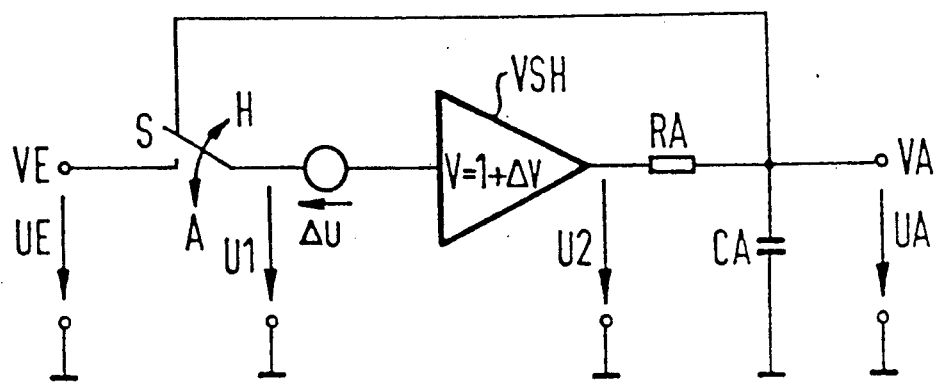
FIG. 3 is a substitute circuit diagram for a sample and hold circuit configuration of FIG. 2, taking physical disturbance variables into account.

FIG. 3 shows a physical substitute circuit diagram of the real sample and hold circuit configuration of FIG. 2. The offset of the amplifier VSH is shown in the form of a voltage source with the voltage $\Delta u$ between the switch S and the input of the amplifier VSH.

The amplification V of the amplifier VSH in FIG. 3 then amounts to $1+\Delta v$. The real output resistance of the amplifier VSH, which differs from 0, is shown as a resistor RA between the output of the amplifier and the output terminal VA.

In the exemplary embodiment of FIG. 3, a stabilizing capacitor CA is provided as the stabilizing network Z between the output terminal VA of the circuit configuration and the reference potential. Corresponding to FIG. 2, the output terminal VA is connected to the switch S and thus fed back to the amplifier input during the hold phase H.

During the sampling phase, on the assumption that the disturbance variables $\Delta u$ and $\Delta v$ are equal to 0, the 3 dB threshold circuit frequency is equal to the reciprocal product of the output resistor RA and the capacitor CA.

The behavior of the circuit configuration of FIG. 3 during the hold phase, and in particular the duration of the metastable states, can be calculated by the following formula, with the voltage U1 taken from the amplifier-side terminal of the switch S and the voltage U2 taken between the amplifier VSH and the output resistor RA, in each case being referred to a terminal having reference potential:

$$U2 = (U1 + \Delta u) \cdot (1 + \Delta v)$$

$$\frac{dUA}{dt} = \frac{1}{CA} \cdot i_c(t) = \frac{U2(t) - UA(t)}{RA\ CA}$$

$$U1 = UA$$

The result is the following differential equation:

$$\frac{dUA}{dt} - \frac{\Delta v}{RA\ CA} \cdot UA = \frac{\Delta u}{RA\ CA} \cdot (1 + \Delta v).$$

The general solution of the differential equation is as follows:

$$UA(t) =$$

$$\left( UAo + \Delta u \cdot \frac{1 + \Delta v}{\Delta v} \right) \cdot \exp\left( \frac{\Delta v \cdot t}{RA\ CA} \right) - \Delta u \frac{1 + \Delta v}{\Delta v}$$

where UAo is the voltage value at the beginning of the hold phase.

Simplified versions of the general solution to the differential equation exist for the special cases in which one of the disturbance variables $\Delta u$ or $\Delta v$ at a time are equal to 0. If $\Delta u = 0$, then the following is obtained:

$$UA(t) = UAo \cdot \exp\left( \frac{\Delta v \cdot t}{RA \cdot CA} \right)$$

and for the special case of $\Delta v = 0$, $$UA(t) = UAo + \frac{\Delta u \cdot t}{RA \cdot CA}$$

It can be seen from the simplified solutions to the differential equation that as the disturbance variables $\Delta u$ and $\Delta v$ become larger, the metastable state of the sample and hold circuit configuration is left behind faster. In the case of $\Delta u = 0$, an exponential variation in the output voltage UA occurs with increasing time t, while in the case of $\Delta v = 0$, an additive term that increases linearly with time is added to the voltage value at the beginning of the sampling phase.

Figure 4:
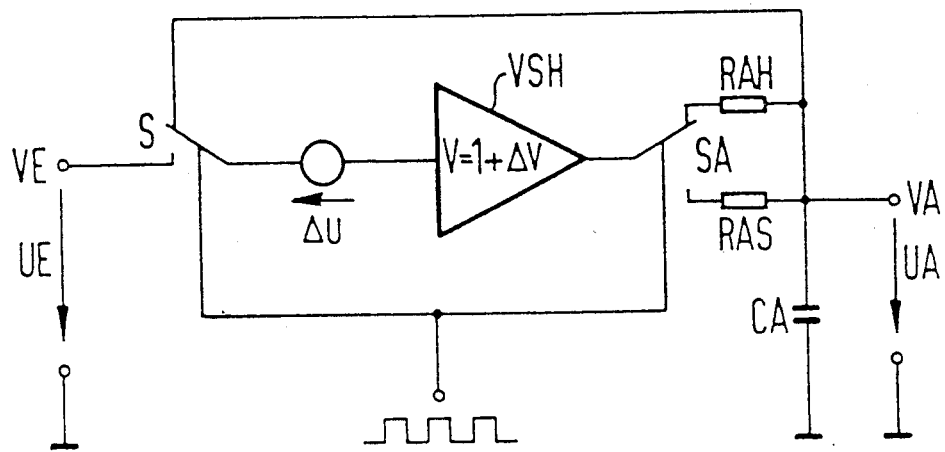
FIG. 4 is a diagram of a sample and hold circuit configuration of FIG. 3 with output time constants that can be toggled.

In the exemplary embodiment of FIG. 4, an additional switch SA is provided at the output of the amplifier VSH. Depending on its position, the additional switch switches an output resistor RAH or an output resistor RAS into the signal path, with RAH being selected to be greater than RAS. This makes the output time constant RAH·CA for the hold phase larger than that for the sampling phase.

Figure 5:
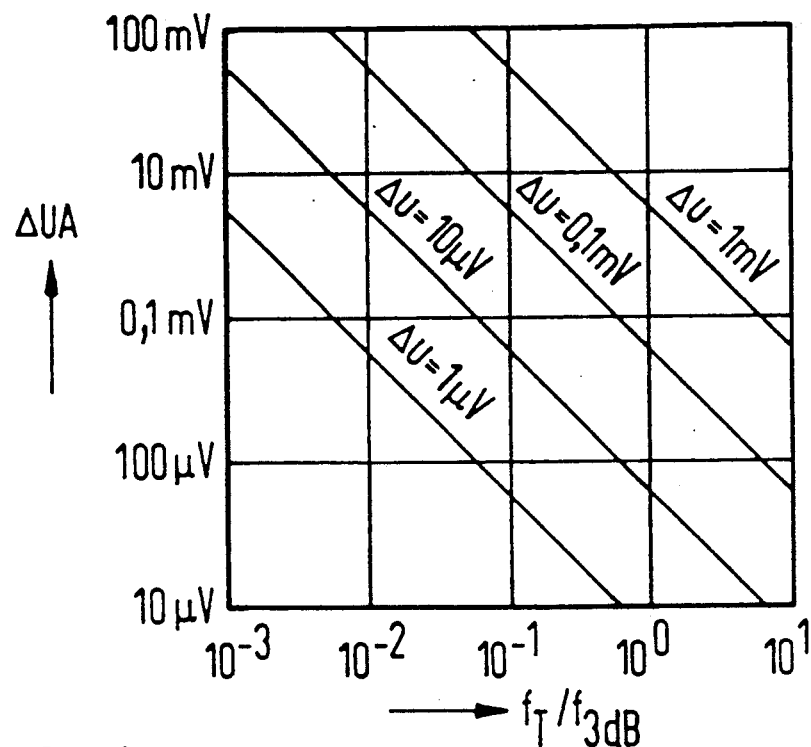
FIG. 5 and FIG. 6 are two graphs for estimating the requirements for accuracy of a sample and hold circuit configuration.
Figure 6:
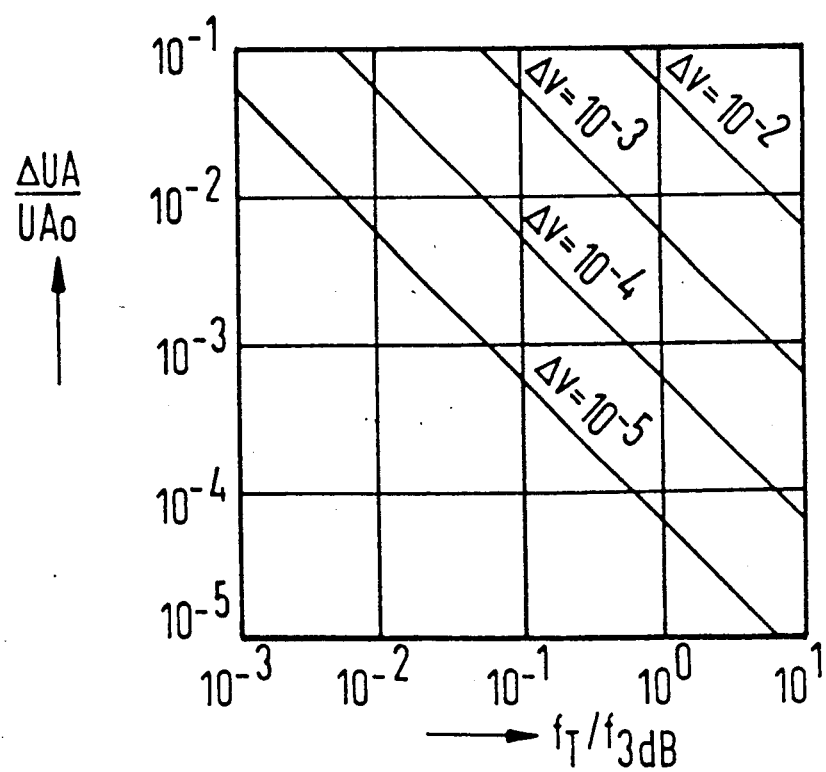

The accuracy requirements to be made of a sample and hold circuit configuration according to the invention are shown in the diagrams of FIGS. 5 and 6. In both diagrams, the abscissa shows the sampling frequency $f_T$ referred to the 3 dB threshold frequency. FIG. 5 shows the variation $\Delta UA$ of the output voltage on the ordinate as a difference between the value UAo of the output voltage at the beginning of the hold phase and the voltage value UA(T) after the time (T), which is equal to the inverse sampling frequency $f_T$.

As parameters, decadically different values for the disturbance variable $\Delta u$ are plotted in FIG. 5. FIG. 6 has the above-defined variation $\Delta UA$ of the output voltage plotted on the ordinate as a relative variable, referred to the value UAo of the output voltage at the beginning of the hold phase, and as parameters it has various decadically stepped values for the disturbance variable $\Delta v$ in the deviation of the amplification factor of the amplifier VSH from the ideal value of 1.

It can be seen from FIGS. 5 and 6 that with disturbance variables $\Delta u$ and $\Delta v$, which can be attained with highly precise monolithically integrated amplifiers, at a sampling frequency of $f_T$ which is approximately equivalent to the 3 dB threshold frequency, or in other words about the abscissa value of 10°, high accuracy of the sample and hold circuit configuration according to the invention can still be attained. The attainable accuracy can be even further increased by selecting different time constants for the sampling and hold phases in accordance with the embodiment of the circuit shown in FIG. 4. Thus this kind of sample and hold circuit configuration according to the invention has the advantage of even being suitable for use in monolithic analog/digital converters that are operated near the Nyquist frequency.

Figure 7:
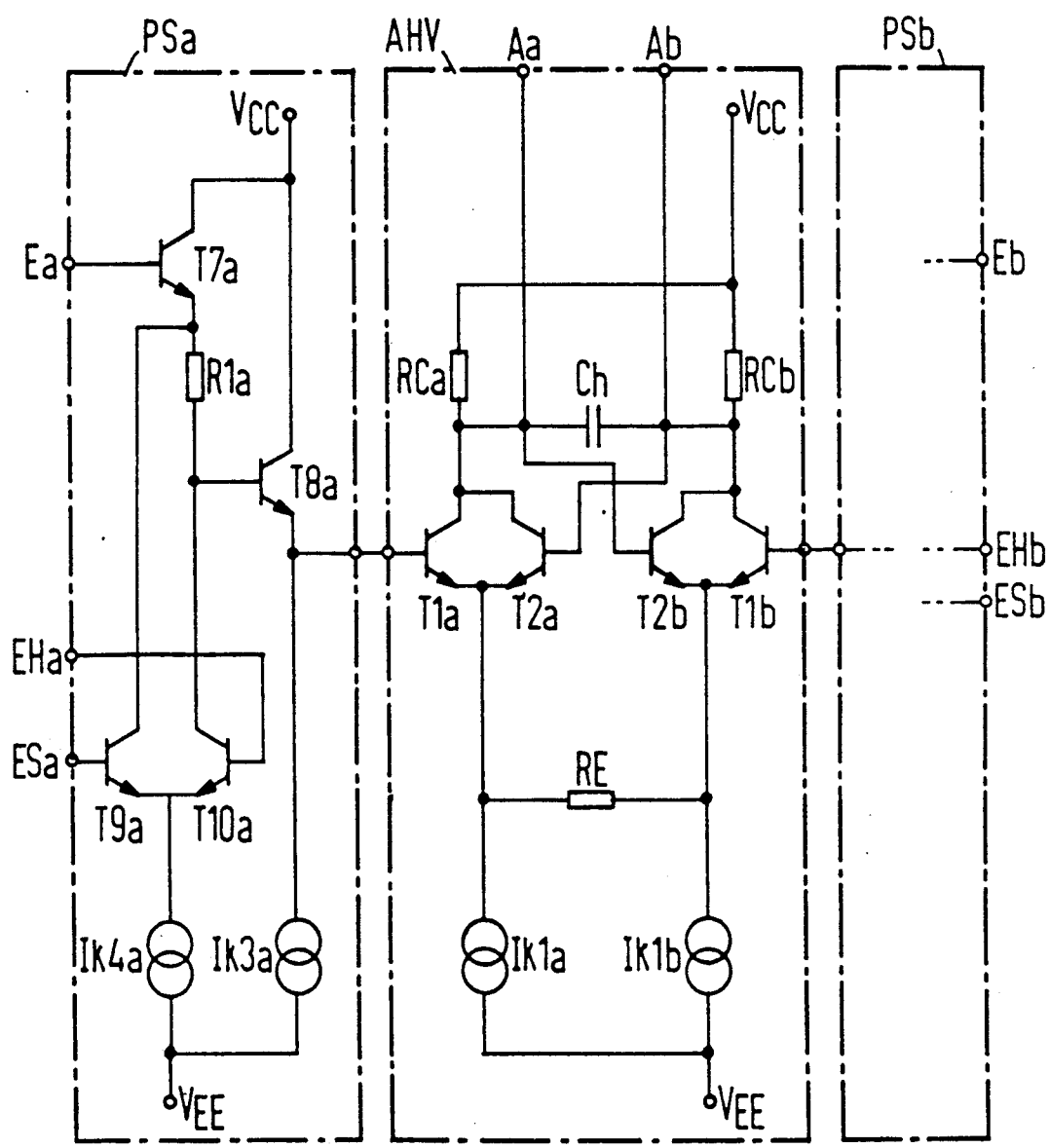
FIG. 7 is a diagram of a sample and hold circuit configuration according to the invention with one possible embodiment of a level shifter.

FIG. 7 shows a circuit configuration with a symmetrically constructed sample and hold amplifier AHV, being formed of a first transistor T1a, a second transistor T1b, a third transistor T2a and a fourth transistor T2b. The collector of the first transistor T1a and the collector of the third transistor T2a are interconnected and form a first output terminal Aa. The collector of the second transistor T1b and the collector of the fourth transistor T2b are interconnected and form a second output terminal Ab. The first output terminal Aa is connected through a first collector resistor RCa to a first supply potential $V_{CC}$. Similarly, the second output terminal Ab is connected to the first supply potential $V_{CC}$ through a second collector resistor RCb. The first output terminal Aa is connected to the control input of the fourth transistor T2b and the second output terminal Ab is connected to the control input of the third transistor T2a.

Figure 8:
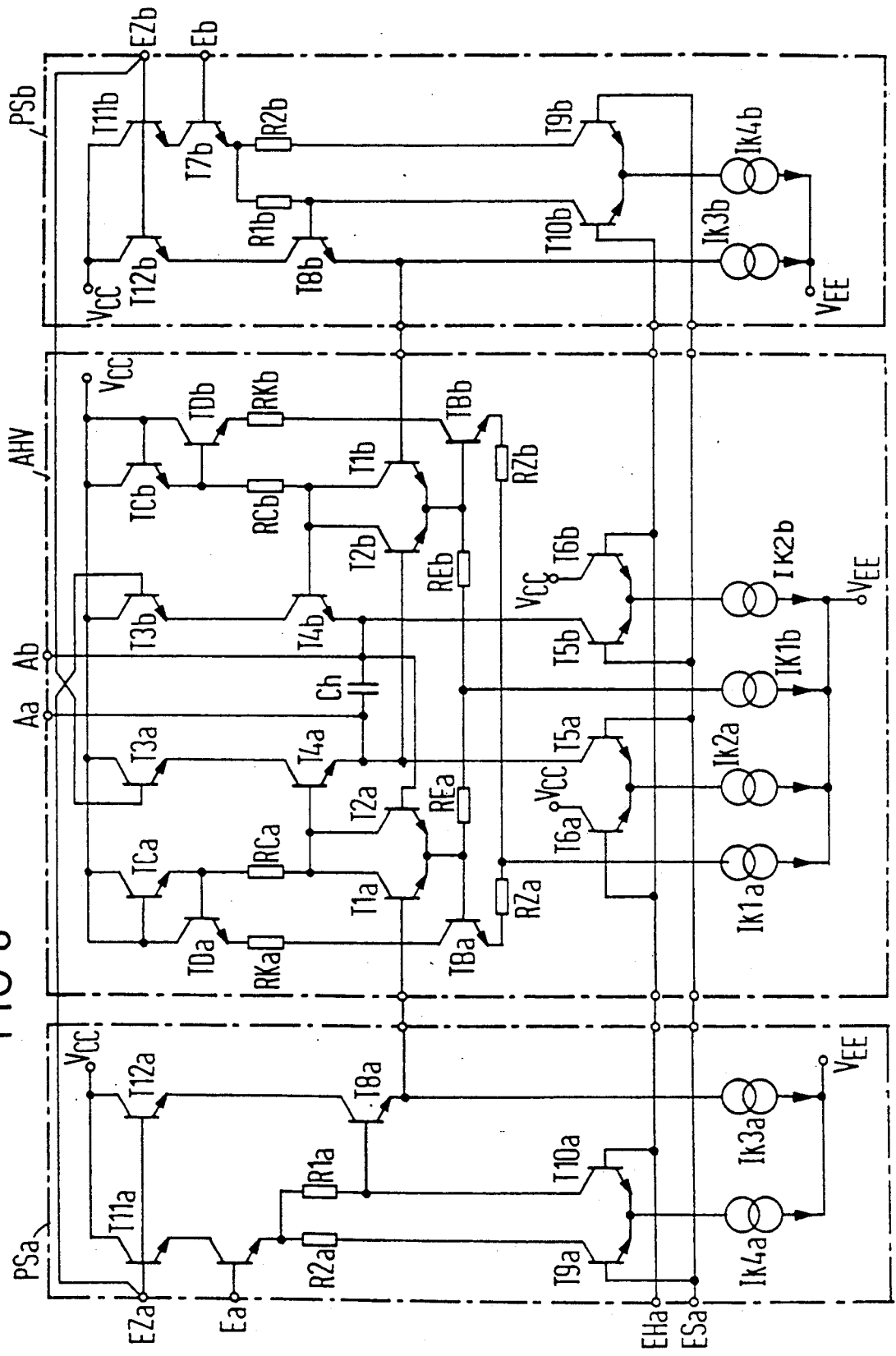
FIG. 8 is a diagram of particularly favorable embodiment of a sample and hold amplifier according to the invention, and a particularly favorable embodiment of level shifter.

The first and second output terminals Aa, Ab are connected to one another through a hold capacitor Ch. The emitter of the first transistor T1a is directly connected to the emitter of the third transistor T2a, and the emitter of the second transistor T1b is directly connected to the emitter of the fourth transistor T2b. The emitters of the first and third transistors T1a, T2a and the emitters of the second and fourth transistors T1b, T2b are connected to one another through at least one resistor RE in FIG. 7 (although resistors REa and REb are seen in FIG. 8). The emitters of the first and third transistors T1a, T2a and the emitters of the second and fourth transistors T1b, T2b are also connected to one another and to a second supply potential $V_{EE}$ through at least one constant current impressing means Ik1a, Ik1b.

The control terminal of the first transistor T1a and the control terminal of the second transistors T1b can be acted upon by a differential signal. According to the invention a first signal input terminal Ea forms the input of a first switchable level shifter PSa and a second signal input terminal Eb, which is provided for a signal complementary to the signal fed to the first signal input terminal Ea, forms the input of a second switchable level shifter PSb. The output of the first switchable level shifter PSa is connected to the control terminal of the first transistor T1a. The output of the second switchable level shifter PSb is connected to the control terminal of the second transistor T1b. A different and in each case constant direct voltage difference exists between the input signal and the output signal of the controllable level shifters PSa, PSb as a function of the switching state of the level shifters.

One characteristic of the invention is considered to be the fact that the signal to be sampled is processed through a switchable level shifter in such a manner that the output signal of that level shifter is formed from the input signal of the level shifter and an additive constant direct voltage component, and that the additive constant direct voltage component assumes at least two different values depending on the switching state of the level shifter. One of these two different values of the additive direct voltage component of the output signal of the level shifter may be equal to 0. However, in the exemplary embodiments of level shifters to be described below, there are typically two different high constant direct voltage components having a negative algebraic sign ($-$). On one hand, the output variable of the level shifter PSa should be constructed in such a way that in one switching position of the level shifter PSa, the first transistor T1a of the sample and hold amplifier AHV, which is triggered by the output signal of the level shifter PSa, will still reliably conduct, given the smallest possible signal to be processed at the input Ea of the level shifter PSa, and the third transistor T2a will still reliably block. On the other hand, in the other switching position of the level shifter PSa, the first transistor T1a which is triggered by the output signal of the level shifter PSa should still reliably block, given the largest possible signal to be processed at the input Ea of the level shifter, while the third transistor T2a will still reliably conduct.

In order to process differential signals, the input Ea of the first level shifter PSa is acted upon by a signal component, and the input Eb of the second level shifter PSb is acted upon by a signal component complementary thereto. The control of the various switching states of the first and second level shifters PSa, PSb must be coupled in such a way that a voltage level that is high or low relative to the input signal thereof is simultaneously present at the outputs of both level shifters PSa and PSb. In other words, in both level shifters, the additive component of the output signals must be of the same magnitude at the same time.

If the level shifters have a relatively high output level, then the output signal of the sample and hold amplifier AHV is determined by the differential amplifier transistor pair T1a, T1b. If the potentials at the control inputs of the first and second transistors T1a, T1b are decreased by a predetermined direct voltage component by toggling of the level shifters PSa and PSb, then the first and second transistors T1a and T1b block. At the same time, however, the third and fourth transistors T2a and T2b conduct, and since the third and fourth transistors T2a and T2b are triggered by the signal fed by the first and second transistors T1a, T1b to the output terminals Aa and Ab, the third transistor T2a carries the current that previously flowed through the first transistor, and the fourth transistor T2b carries the current that previously flowed through the second transistor T1b. In a sample and hold circuit configuration according to the invention, the sampling phase then exists when the output signal of the first level shifter PSa is higher than the signal at the output terminal Ab of the sample and hold amplifier AHV, and the signal at the output of the second level shifter PSb is higher than the signal at the output terminal Aa of the sample and hold amplifier AHV. A circuit configuration according to the invention is in the holding phase when the signal at the output terminal Ab is higher than the signal at the output of the first level shifter PSa, and the signal at the output terminal Aa is higher than the signal at the output of the second level shifter PSb.

Since both the collector circuit wiring and the emitter circuit wiring of the first and third transistors T1a, T2a, are identical to that of the second and fourth transistors T1b, T2b, and the constant current impressing means Ik1a, Ikb are identical, and no current is switched within the sample and hole amplifier, the output signal of sample and hold circuit configurations according to the invention remains the same upon toggling over from the sampling mode to the holding mode. No toggling-induced excessive currents arise in the sample and hold amplifier, and thus there are no signal jumps at the output terminals Aa and Ab.

Since the output signal of the sample and hold amplifier in the hold phase is dependent on the differential signal present between the output terminals Aa and Ab, a simultaneous drop in the signal level at both output terminals Aa and Ab by a predetermined direct voltage component has no influence on the signal.

If the amplification factor of a sample and hold amplifier according to the invention is as accurately as possible at 1, then as can be inferred from the above explanations, such a circuit can make do with a small hold capacitor Ch, which leads to a very high processing frequency.

Such an amplifier is attained by providing the same current and voltage behavior in both the collector circuit and the emitter circuit. To this end, the resistor RE should be as large as the sum of the resistors RCa and RCb in FIG. 7 (or the resistors RCa, REa, RCb and REb should be of the same magnitude as far as possible in FIG. 8).

FIG. 8 shows a circuit that makes it possible to achieve the amplification factor of 1. Above all, the sample and hold amplifier circuit AHV shown in FIG. 8 differs from the circuit shown in FIG. 7 due to the fact that the emitter terminal of the first transistor T1a and the emitter terminal of the third transistor T2a are interconnected directly to the base terminal of another or ninth transistor TBa and to one terminal of a first emitter resistor REa. The emitter terminal of the second transistor T1b and the emitter terminal of the fourth transistor T2b are interconnected directly to the base terminal of a further or tenth transistor TBb and to one terminal of a second emitter resistor REb. The other terminals of the two emitter resistors REa, REb are connected through constant current impressing means Ik1b to the second supply potential $V_{EE}$. The emitter terminal of the ninth transistor TBa is connected through a series circuit of two additional resistors RZa, RZb to the emitter terminal of the tenth transistor TBb. A circuit node that interconnects the two additional resistors RZa, RZb is connected through further constant current impressing means Ik1a to the second supply potential $V_{EE}$. The collector terminal of the ninth transistor TBa is connected through another resistor RKa to the first supply potential $V_{CC}$. The collector terminal of the tenth transistor TBb is similarly connected to the first supply potential $V_{CC}$ through a further resistor RKb. In addition, the first supply potential $V_{CC}$ is connected through respective diodes TCa, TCb connected in the conducting direction to the first and second collector resistors RCa, RCb. The transistors TCa, TCb are provided as diode paths with the collector terminals thereof being short-circuited to the base terminals thereof. The emitter terminals of the two transistors TCa, TCb are each connected to the base terminal of respective eleventh or twelfth transistor TDa, TDb. The collector terminal of the added or eleventh transistor TDa and the collector terminal of the additional or twelfth transistor TDb are each acted upon directly by the first supply potential $V_{CC}$. The emitter terminal of the eleventh transistor TDa is connected through the resistor RKa to the collector terminal of the ninth transistor TBa, and the emitter terminal of the twelfth transistor TDb is connected through the resistor RKb to the collector terminal of the tenth transistor TBb. In order to attain the amplification factor of 1, the resistors and the transistors in this amplifier circuit should be as identical as possible.

The base current that is supplied to the first transistor T1a or, in the hold phase, to the third transistor T2a, is dissipated again through the ninth transistor TBa. As a result, the same current flows in both the collector resistor RCa and the emitter resistor REa. The voltage drop over the respective base-to-emitter diodes of the first transistor T1a and the third transistor T2a in the emitter circuit can be compensated for by the transistor TCa in the collector circuit. A particular embodiment is shown in this case in FIG. 8, because the base current of the transistor TCa can be dissipated from the amplifier circuit through the eleventh transistor TDa.

It is recommended that the amplifiers serving the purpose of voltage compensation, being formed of the elements TDa, TDb RKa, RKb, TBa, TBb, RZa, RZb and Ik1a, be of an identical layout to the actual sample and hold amplifier being formed of the elements TCa, TCb, RCa, RCb, T1a or T2a, T1b or T2b, REa, REb and Ik1b.

In order to decouple the sample and hold amplifier from loads connected to the output side, and because of the output impedance of the circuit, which is important to the hold behavior, it is recommended that the collector terminals of the first and third transistors T1a, T2a do not directly form the first output terminal Aa but instead are connected to the control terminal of a first impedance converter T4a and are also are connected through the first collector resistor RCa to the first supply potential $V_{CC}$, as shown in FIG. 8. Similarly, it is recommended that the collector terminals of the second and fourth transistors T1b, T2b do not directly form the second output terminal Ab but instead are connected to the control terminal of a second impedance converter T4b and are connected to the first supply potential $V_{CC}$ through the second collector resistor RCb. The output of the first impedance converter T4a forms the first output terminal Aa and the output of the second impedance converter T4b forms the second output terminal Ab. This can be attained in particular by providing that the first and second impedance converters are respectively provided by seventh and eighth transistors T4a, T4b in an emitter follower circuit. The collector terminals of the seventh and eighth transistors T4a, T4b are respectively connected to the first supply potential $V_{CC}$. The emitter terminals of the seventh and eighth transistors T4a, T4b which form the first and second output terminals Aa, Ab of the circuit configuration, are each connected to the second supply potential $V_{EE}$ through respective second and third constant current impressing means Ik2a, Ik2b.

In a circuit as described, the output time constant can be varied by providing that second constant current impressing means Ik2a are switchable through a first toggle T5a, T6a, to either the emitter terminal of the seventh transistor T4a or to a supply potential, such as the first supply potential $V_{CC}$, and that third constant current impressing means Ik2b are switchable through a second toggle T5b, T6b, to either the emitter terminal of the eighth transistor T4b or to a supply potential for instance, the first supply potential $V_{CC}$. In the hold phase, the seventh transistor T4a is then switched to be without current through the first toggle T5a, T6a, and the eighth transistor T4b is switched to be without current through the second toggle T5b, T6b, which leads to a large time constant.

In order to prevent nonlinearities, which arise as a result of the early effect, this described impedance converter circuit can be modified in such a way that the controllable path of transistors T3a, T3b are respectively connected between the first supply potential $V_{CC}$ and the collector terminals of the seventh and eighth transistors T4a, T4b. Furthermore, the control input of the transistor T3a which is connected to the seventh transistor T4a is acted upon by a signal derived from the signal present at the input Eb of the second level shifter PSb and that the control input of the transistor T3b which is connected to the eighth transistor T4b is acted upon by a signal derived from the signal present at the input Ea of the first level shifter PSa. The signal with which the transistor T3a is acted upon differs by a constant direct voltage component from the signal with which the input Eb is acted upon, and the signal with which the transistor T3b is acted upon differs by a constant direct voltage component from the signal by which the input Ea is acted upon. This direct voltage component should be selected in such a way that the transistors in both impedance converter stages do not attain saturation.

FIG. 7 discloses a particular exemplary embodiment of a level shifter, wherein the input Ea of the level shifter PSa provided for the signal to be sampled, is connected to the control input of an input transistor T7a. The collector terminal of the input transistor T7a is connected to the first supply potential $V_{CC}$. The emitter terminal of the input transistor T7a is connected through at least one shift resistor R1a to both the control input of an output transistor T8a and one alternating input of a third toggle T9a, T10a. The emitter terminal of the input transistor T7a is also connected to the other alternating input of the third toggle T9a, T10a. The central input of the third toggle T9a, T10a is connected through constant current impressing means Ik4a to the second supply potential $V_{EE}$. The collector terminal of the output transistor T8a is connected to the first supply potential $V_{CC}$. The emitter of the output transistor T8a forms the output of the first level shifter PSa and is connected through further constant current impressing means Ik3a to the second supply potential $V_{EE}$. For the sake of symmetry, the other alternating input of the third toggle can also be connected through a resistor R2a to the emitter terminal of the input transistor T7a, as shown in FIG. 8. The resistor R2a is typically of the same size as the shift resistor R1a. The output transistor T8a is connected as an impedance converter. Naturally, any known impedance converter can be used in this case.

A particularly favorable embodiment shown in FIG. 8 is obtained if the collector terminal of the input transistor T7a is connected through the controllable path of a further transistor T11a to the first supply potential $V_{CC}$, and if the collector terminal of the output transistor T8a is similarly connected through the controllable path of a further transistor T12a to the first supply potential $V_{CC}$. The control inputs of the transistors T11a and T12a are interconnected and form an additional signal input EZa of the level shifter. In this case it is necessary for the signal with which the input EZa is acted upon to differ from the signal with which the input Ea is acted upon, by a constant direct voltage component. This direct voltage component should be selected in such a way that the transistors in the level shifter do not attain saturation. Such a circuit makes it possible to compensate for nonlinearities that occur as a result of the early effect.

Although only part of the total circuit has been described above, it is self-evident that because of the symmetrical layout, this description is equally applicable to the other half of the total circuit. Because of the symmetry, corresponding circuit elements are distinguished by the letters a and b after their reference numerals. A sample and hold circuit configuration of this kind according to the invention can be achieved not only with transistors of most various types, such as bipolar transistors, MOSFETs, MISFETs, or MESFETSs, but also by various technologies, such as silicon, gallium arsenide and other technologies.

We claim:

1. Circuit configuration, comprising: a symmetrically constructed sample and hold amplifier including first, second, third and fourth transistors each having a collector, an emitter and a control terminal, the collectors of said first and said third transistors being interconnected to form a first output terminal, the collectors of said second and said fourth transistors being interconnected to form a second output terminal, a first collector resistor connected between said first output terminal and a first supply potential, a second collector resistor connected between said second output terminal and the first supply potential, said first output terminal being connected to the control terminal of said fourth transistor, said second output terminal being connected to the control terminal of said third transistor, a hold capacitor connected between said first and second output terminals, the emitter of said first transistor being directly connected to the emitter of said third transistor, the emitter of said second transistor being directly connected to the emitter of said fourth transistor, at least one resistor connected between the emitters of said first and third transistors and the emitters of said second and fourth transistors, and at least one constant current impressing means connecting the emitters of said first and third transistors and the emitters of said second and fourth transistors to each other and to a second supply potential; a first switchable level shifter having an input in the form of a first signal input terminal for receiving a given signal, and an output being connected to the control terminal of said first transistor for supplying a differential output signal; and a second switchable level shifter having an input in the form of a second signal input terminal for receiving a signal complementary to the given signal, and an output being connected to the control terminal of said second transistor for supplying a differential output signal; said level shifters each having a switching state; the input and output signals of each of said switchable level shifters having a different constant direct voltage difference as a function of said switching state of said level shifters.

2. Circuit configuration according to claim 1, including a first impedance converter having an output connected to said first output terminal and a control terminal connected to the collectors of said first and third transistors, said first collector resistor being connected between the collectors of said first and third transistors and the first supply potential; and a second impedance converter having an output connected to said second output terminal and a control terminal connected to the collectors of said second and fourth transistors, said second collector resistor being connected between the collectors of said second and fourth transistors and the first supply potential.

3. Circuit configuration according to claim 2, wherein said first and second impedance converters are transistors in emitter follower circuits having collectors connected to the first supply potential, said transistor of said first impedance converter having an emitter connected to said first output terminal, said transistor of said second impedance converter having an emitter connected to said second output terminal, and said at least one constant current impressing means are first constant current impressing means, and including second constant current impressing means connected between the emitter of said transistor of said first impedance converter and a second supply potential, and third constant current impressing means connected between the emitter of said transistor of said second impedance converter and the second supply potential.

4. Circuit configuration according to claim 3, including a first toggle switching said second constant current impressing means between the emitter of said transistor of said first impedance converter and a given supply potential, and a second toggle switching said third constant current impressing means between the emitter of said transistor of said second impedance converter and the given supply potential.

5. Circuit configuration according to claim 4, wherein the given supply potential is the first supply potential.

6. Circuit configuration according to claim 3, including a transistor having a controllable path connected between the first supply potential and the collector of said transistor of said first impedance converter, and a control terminal being acted upon by a signal derived from the signal present at said input of said second level shifter; and a transistor having a controllable path connected between the first supply potential and the collector of said transistor of said second impedance converter, and a control terminal being acted upon by a signal derived from the signal present at said input of said first level shifter.

7. Circuit configuration according to claim 1, wherein each of said level shifters includes an input transistor having a control terminal connected to said input of said level shifter for a signal to be sampled, a collector connected to the first supply potential and an emitter; and including at least one shift resistor connected to the emitter of said input transistor; an output transistor having a control terminal connected to said at least one shift resistor, a collector connected to the first supply potential and an emitter forming said output of said level shifter; a toggle having one alternating input connected to said at least one shift resistor, another alternating input connected to the emitter of said input transistor and a central input; other constant current impressing means connected between said central input and the second supply potential; and further constant current impressing means connected between the emitter of said output transistor and the second supply potential.

8. Circuit configuration according to claim 1, including another transistor having an emitter and a collector and having a control terminal connected to the emitters of said first and third transistors, a first emitter resistor having one terminal connected to the emitters of said first and third transistors; a further transistor having an emitter and a collector and having a control terminal connected to the emitters of said second and fourth transistors, a second emitter resistor having one terminal connected to the emitters of said second and fourth transistors; said first and second emitter resistors having other terminals being connected to each other and being connected through said at least one constant current impressing means to the second supply potential; a series circuit having two additional resistors being interconnected at a circuit node, said series circuit being connected between the emitter of said other transistor and the emitter of said further transistor; further constant current impressing means connected between said circuit node and the second supply potential; a first collector resistor connected between the collector of the other transistor and the first supply potential; and a second collector resistor connected between the collector of the further transistor and the first supply potential.

9. Circuit configuration according to claim 8, including diodes connected in the conducting direction, each of said diodes being connected between the first supply potential and a respective one of said first and second collector resistors.

10. Circuit configuration according to claim 9, wherein each of said diodes has a diode path in the form of a respective transistor having an emitter and a short-circuited collector and control terminal, and including added and additional transistors each having a control terminal connected to the emitter of a respective one of said transistors of said diodes, the collectors of said added and additional transistors being directly acted upon by the first supply potential, said other resistor being connected between the emitter of said added transistor and the collector of said other transistor, and said further resistor being connected between the emitter of said additional transistor and the collector of said further transistor.

11. Circuit configuration, comprising: a symmetrically constructed sample and hold amplifier; a first switchable level shifter having an input in the form of a first signal input terminal for receiving a given signal, and an output being connected to said sample and hold amplifier for supplying a differential output signal; and a second switchable level shifter having an input in the form of a second signal input terminal for receiving a signal complementary to the given signal, and an output being connected to said sample and hold amplifier for supplying a differential output signal; said level shifters each having a switching state; the input and output signals of each of said switchable level shifters having a different constant direct voltage difference as a function of the switching state of said level shifters, each of said level shifters including an input transistor having a control terminal connected to said input of said level shifter for a signal to be sampled, a collector connected to a first supply potential and an emitter; at least one shift resistor connected to the emitter of said input transistor; an output transistor having a control terminal connected to said at least one shift resistor, a collector connected to the first supply potential and an emitter forming said output of said level shifter; a toggle having one alternating input connected to said at least one shift resistor, another alternating input connected to the emitter of said input transistor and a central input; constant current impressing means connected between said central input and a second supply potential; and other constant current impressing means connected between the emitter of said output transistor and the second supply potential.

* * * * *